(12) United States Patent
Andreev et al.

(10) Patent No.: US 6,507,939 B1
(45) Date of Patent: Jan. 14, 2003

(54) NET DELAY OPTIMIZATION WITH RAMPTIME VIOLATION REMOVAL

(75) Inventors: Alexander E. Andreev, San Jose, CA (US); Anatoli A. Bolotov, Cupertino, CA (US); Igor A. Vikhliantsev, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 105 days.

(21) Appl. No.: 09/858,166

(22) Filed: May 15, 2001

(51) Int. Cl.$^7$ .............................................. G06F 17/50
(52) U.S. Cl. .................. 716/10; 716/2; 716/6
(58) Field of Search ........................ 716/1–6, 10, 11–18

(56) References Cited

U.S. PATENT DOCUMENTS 5,774,371 A * 6/1998 Kawakami .................. 716/10
5,917,729 A * 6/1999 Naganuma et al. ........... 716/10
6,145,117 A * 11/2000 Eng .............................. 716/2
6,223,334 B1 * 4/2001 Suaris et al. ................. 716/12
6,425,115 B1 * 7/2002 Risler et al. .................. 716/6

* cited by examiner

Primary Examiner—Matthew Smith
Assistant Examiner—Paul Dinh
(74) Attorney, Agent, or Firm—Luedeka, Neely & Graham

(57) ABSTRACT

The specification discloses a for reduction of net delays and insertion of buffers in a logic tree having a root and a plurality of leaves. The steps of the method include inserting a plurality of auxiliary nodes into the, defining discrete, approximate scales for delay, load, and ramp time, constructing a set of buffers chains for later insertion into the net tree, determining for each node on the tree a tradeoff function relating ramp time, departure time and load at the node, for each node, removing combinations of the tradeoff functions and the buffer chains, which when inserted into the tradeoff function, lead to a ramp time which exceeds a predetermined maximum allowable ramp time, for each node, using the tradeoff function to determine a minimum delay to insert, and inserting the buffer chain corresponding to the minimum delay as determined by the tradeoff function.

18 Claims, 6 Drawing Sheets

NET DELAY OPTIMIZATION WITH RAMPTIME VIOLATION REMOVAL

FIELD

The invention relates to the field of integrated circuit design, and in particular to a method and system for timing optimization during integrated circuit design.

BACKGROUND

Integrated circuits consist of a large number of electronic components which include individual logic devices or groups of logic devices which are applied to the surface of a substrate, typically a silicon wafer. The components or "cells" are typically grouped to produce an application specific integrated circuit. For each application specific integrated circuit, placement of the components in optimum positions provides efficient layout of the components on the chip in order to reduce chip costs, processor delays, size and the like. Because the application specific integrated circuits typically contain hundreds of thousands if not millions of components, the task of optimizing the placement of components on a chip surface is not practical without the aid of computers.

In addition to the physical placement of cells on the chip, designers must also address timing issues associated with the propagation of signals from one cell to another. For this purpose the sequence of logic gates or other components in a net may be thought of as forming a "logic tree," or more simply a "tree." In order for the integrated circuit design to function properly the numerous signals being transmitted between cells in the tree must be substantially synchronized. Thus, designers must make allowance for the delays inherent in the components of the integrated circuit and the routing between the components. This may include inserting extra delays along certain faster routes, such as by addition of buffer components to synchronize those faster routes with slower routes.

However, while extra delays may be added, it desirable to minimize the total delays within a net and in particular to insure that no delay exceeds a specified maximum, a condition referred to as a "ramp time violation." As integrated circuit designs continue to evolve to include more components and to operate at higher speeds, there is an accompanying continuing need for quicker, yet accurate, methods of analyzing and optimizing delays in a net.

SUMMARY

To address the aforementioned need, the present invention provides a method for reduction of net delays and insertion of buffers in a logic tree having a root and a plurality of leaves. The steps of the method include inserting a plurality of auxiliary nodes into the tree so that no node is a greater distance removed from a next node than a predetermined value, defining discrete, approximate scales for delay, load, and ramp time, constructing, from a library set of buffers, a set of buffers chains for later insertion into the net tree, determining for each node on the tree a tradeoff function relating ramp time, departure time and load at the node, for each node, removing combinations of the tradeoff functions and the buffer chains, which when inserted into the tradeoff function, lead to a ramp time which exceeds a predetermined maximum allowable ramp time, for each node, using the tradeoff function to determine a minimum delay to insert, and inserting the buffer chain corresponding to the minimum delay as determined by the tradeoff function.

In certain preferred embodiments of the method the minimum delays are calculated in order from the leaves of the tree to its root and the buffer chains are thereafter inserted in reverse order from the root to the leaves.

In certain other preferred embodiments at least one of the approximate scales is a logarithmic scale. Moreover, both the ramp time and load scales are approximate.

It is also preferred that the buffer chains include combinations of inverting and noninverting buffers.

In still another preferred embodiment, the tradeoff function for each node is a monotonically decreasing step function. In another preferred embodiment, the tradeoff function is a vector function.

In another aspect, the invention relates to a program on a readable computer storage medium including instructions for performing the aforementioned method for reduction of net delays and insertion of buffers in a logic tree having a root and a plurality of leaves.

In still another aspect, the invention relates to a computing device configured to perform a method for reduction of net delays and insertion of buffers in a logic tree having a root and a plurality of leaves.

BRIEF DESCRIPTION OF THE DRAWINGS.

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
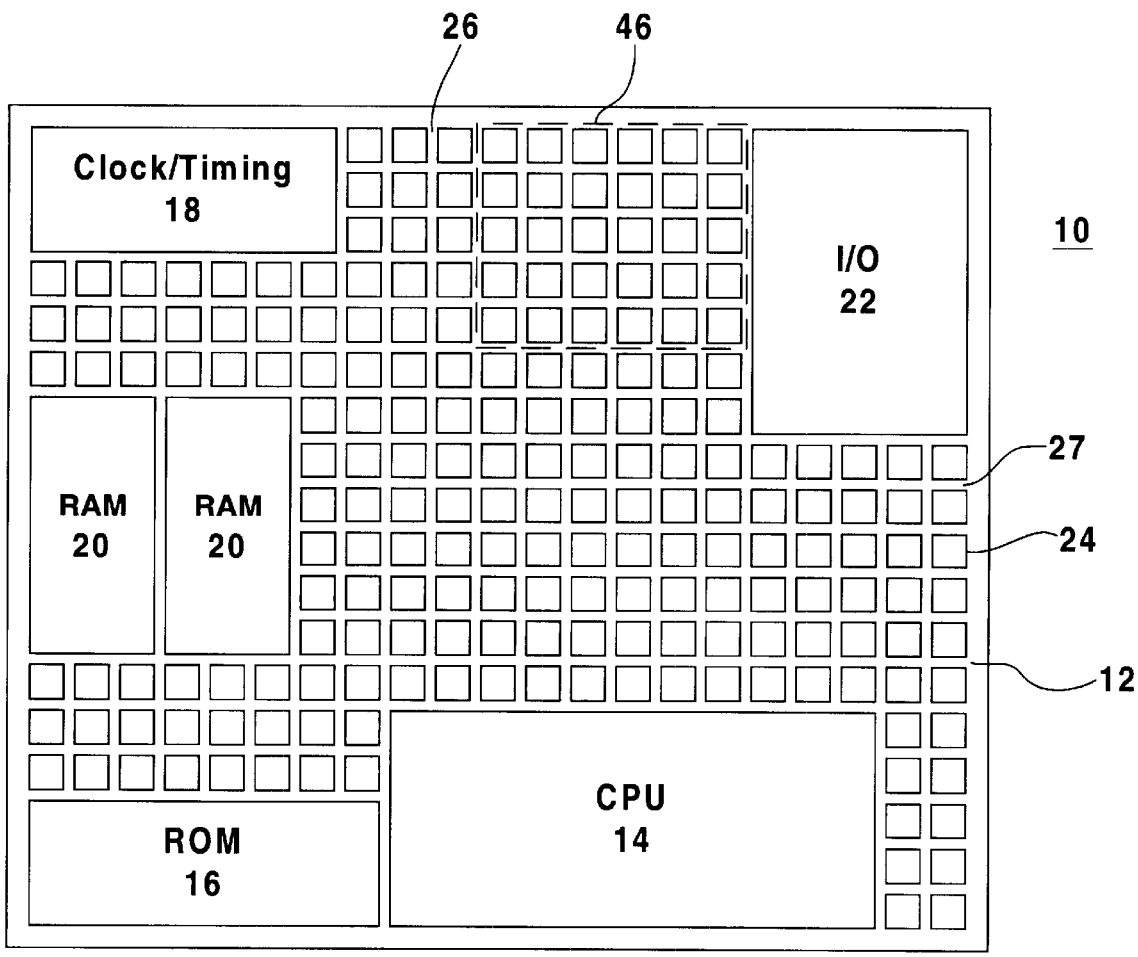
FIG. 1 is a representational diagram of a typical integrated circuit.

Referring now to FIG. 1 there is shown an integrated circuit chip 10 provided on a semiconductor substrate 12, such as a silicon wafer, having a plurality of components thereon. Generally speaking, the components of the chip 10 are made by layering various materials on the substrate 12. The arrangement of the components on the substrate 12 is described in terms of a geometric description referred to as a "layout," characterized by a plurality of planar geometric shapes separated from one another and arranged on the substrate 12. Masks or patterns corresponding to the layout are used to render the desired shapes in the desired locations on the substrate 12 in a series of photolithographic steps.

For example, the chip 10 includes a plurality of functional circuit blocks formed thereon, such as central processing unit 14, read-only memory (ROM) 16, clock/timing unit 18, random access memories (RAM) 20, and input/output interface (I/O) 22. The circuit chip 10 also includes numerous (e.g., from about 10,000 to several million) cells 24. The cells 24 and the other components of the chip 10 are interconnected or routed according to a desired logical design of the chip corresponding to a desired application. This routing or interconnection is accomplished by electrically conductive lines or traces located in vertical channels 26 and horizontal channels 27 between the cells 24.

Each cell 24 corresponds to a logic element, such as a gate, or to a combination of logic elements interconnected to perform a specific function. For example, and with reference to FIG. 2, there is shown a logic tree 28 defined by a plurality of logic cells 30. Each logic cell 30 is one of the cells 24 which has an output pin provided by a standard logic gate. With reference to FIGS. 3a–3f, there are shown, respectively, examples of standard logic gates such as AND gate 30a, NAND gate 30b, NOT gate 30c, OR gate 30d, NOR gate 30e, and EXCLUSIVE OR gate 30f.

Figure 2:
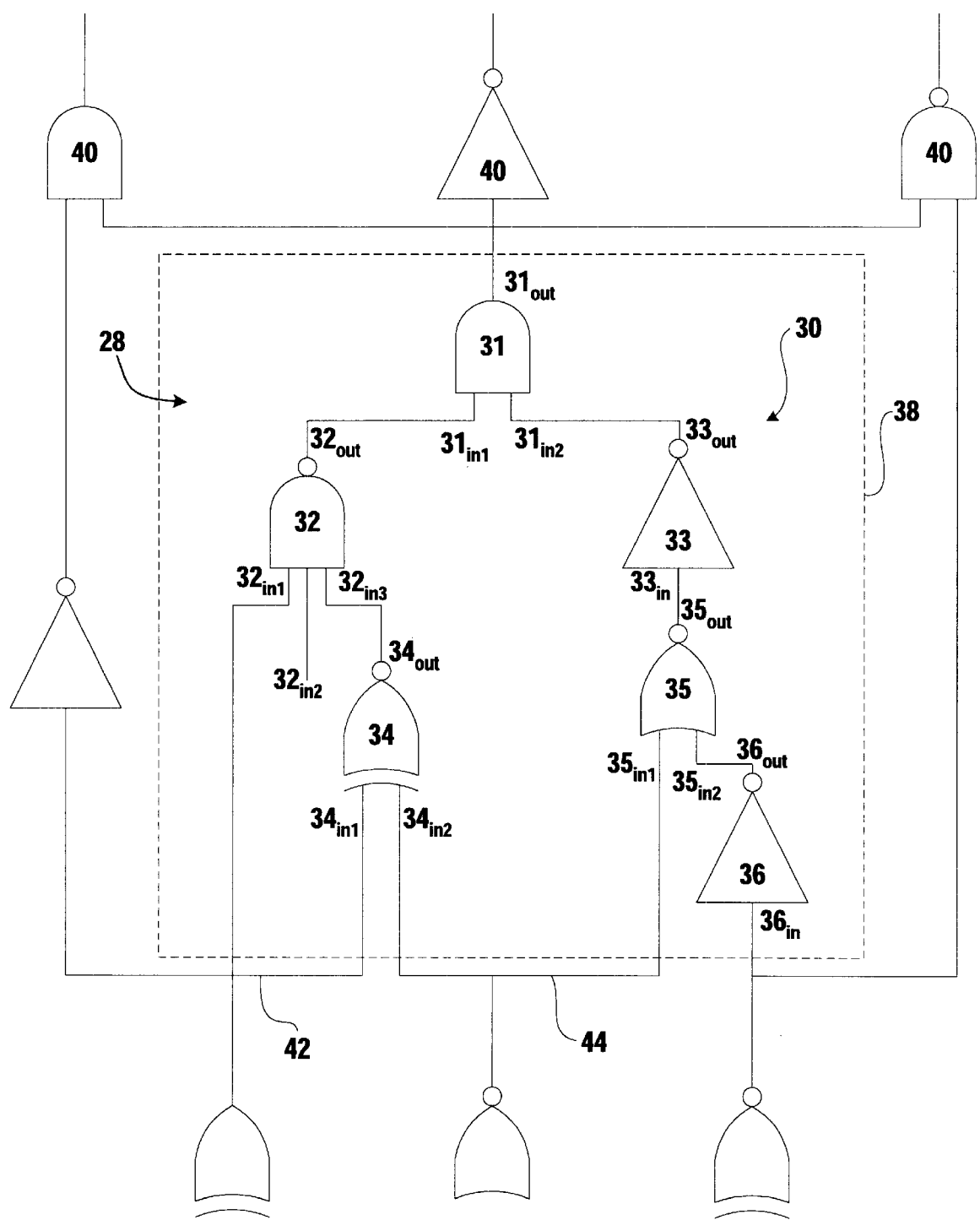
FIG. 2 is a representational diagram of a logic tree.
Figure 3A:
FIGS. 3a–3f are examples of standard logic gates.
Figure 3B:
Figure 3C:
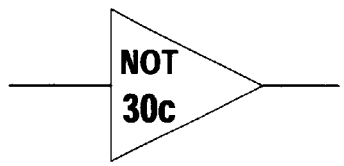
Figure 3D:
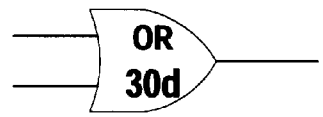
Figure 3E:
Figure 3F:

Accordingly, and with additional reference to FIG. 2, logic tree 28 includes six cells 31–36 located within a rectangle 38 indicated in dashed lines. Each of the cells 31–36 has a single output pin, designated 31out–36out, respectively. Each of the cells 31–36 also has one or more input pins. For example, cell 31 has input pins $31_{in1}$ and $31_{in2}$. Cell 32 has input pins $32_{in1}$, $32_{in2}$, and $32_{in3}$. In the same manner, cells 33–36 respectively have input pins $33_{in}$, $34_{in1}$, $34_{in22}$, $35_{in1}$, $35_{in2}$, and $36_{in}$.

As will be noted, the output pins of the cells 32–36 each connect to a single input pin, namely an input pin of another of the cells 31–33 and 35. The output pin of the cell 31 does not connect to any input pin of any of the cells within the tree 28 and, because of this, the cell 31 is referred to as the "root" of the logic tree 28. The output pin of the root cell can be connected with any number of input pin cells, such as the input pins of the cells designated 40 and located outside of the rectangle 38. The input pins $32_{in1}$, $34_{in1}$, $35_{in1}$, and $36_{in}$ are connected with cells located outside of the tree 28 and are referred to as "entrances" to the tree. Some of the input values of the entrances are connected with a wire and are identical to one another. That is, pins $32_{in1}$ and $34_{in1}$ are connected by wire 42 and have the same input value, and the pins $34_{in2}$ and $35_{in1}$ are connected by wire 44 and have the same input value.

As a part of arranging the components of the chip 10, extra delays must typically be provided on certain paths along a logic tree to synchronize the transmission of signals to various logic elements. These delays are preferably added by the insertion of a series of buffers within the logic trees. The invention relates to a method for determining an appropriate buffer insertion scheme which minimizes net delay and insures that "ramp time violations" are prevented.

The invention provides a new method of accomplishing the above by making use of a "tradeoff function" which is applied to each node of a tree for buffer insertion analysis. In particular, and with further reference to the flowchart of FIG. 5, the method of the invention includes inserting a plurality of auxiliary nodes into the tree so that no node is a greater distance removed from a next node than a predetermined value 110, defining discrete, approximate scales for delay, load, and ramp time 120, constructing a set of generalized buffers for later insertion into the net tree 130, calculating for each node on the tree a tradeoff function 140, removing ramp time violations using the tradeoff function 150, minimizing delays using the tradeoff function 160, and inserting generalized buffers based on the tradeoff function 170.

Initial Ordering and Set Up of the Net Tree

The first step in the method, 110, preferably consists of preparation of the net tree 28. Each of the logic elements of the tree may be considered a "vertex" or "node" and each of the connections between adjacent nodes may be referred to as an "edge." According to the method, a maximum distance is specified for the separation between adjacent nodes or vertices. If the distance between two nodes in the original tree exceeds this maximum distance, extra auxiliary or "dummy" nodes are inserted therebetween so that the distance between any two nodes (now including the auxiliary nodes) does not exceed some specified maximum. The original tree plus the newly added auxiliary nodes form a new tree TD having a set of vertices including the original and auxiliary vertices V.

As a part of preparing the tree, the vertices V in the tree TD are numbered in topological order by well known procedures. The vertices are also divided into levels based on the number of edges from the vertex to the net input. These levels determine the order in which the vertices are analyzed in the optimization procedure.

Definition of Approximate Measurement Scales

After the initial arrangement of the net tree 110, the next step in the process 120 involves substitution of approximate measurement scales for real values of certain parameters, including delay, load, and ramp time. For each of these parameters, each scale, rather than being continuous, is divided into a discrete number of intervals i, and all values within a given interval are treated as being equal.

The delay scale is defined as D with intervals from zero to some delaymax of size timestep.

The load scale L is preferably a logarithmic scale ranging from some minimum loadmin to a maximum loadmax with an initial step loadstep and every next step being loadfactor larger. With every index i along the scale, there is associated a load value l(i) which is taken as the approximate value of all load values along the interval. The load scale L may include up to one hundred intervals.

The ramp time scale R is preferably likewise a logarithmic scale ranging from zero to some maximum. The ramp time scale is divided into a relatively small number of intervals on the order of about 10.

Finally, for each scale an index function Ind(x) is defined which for a given value x finds the corresponding index value on the scale. In other words, it takes a real value x and converts it into an approximate value on the scale.

By converting all the possible real values into a relatively small number of index values, the complexity of later calculations is significantly reduced. Moreover, it has been found that with appropriate choice of the index ranges and intervals, as described above, the loss in accuracy is limited to an acceptable level.

Construction of Buffer Sets

Next a set of buffer sequences or chains B is preferably constructed from a library set of buffers, preferably including both inverting and noninverting buffers, for later insertion into the logic tree as indicated at block 130 in the FIG. 5. The goal of this step is to pre compute an appropriate arrangement of buffers to insert into tree for any given set of delay and load characteristics required at an insertion point. In determining the buffer set B, all possible combinations of buffers in the library are considered, including the use of both inverting and noninverting buffers, and those combinations which are redundant of other combinations are removed so as to lead to a final, non redundant set of buffer combinations B which can be used to meet all the delays later determined to be required in the tree.

In addition, for each buffer buf in the buffer set B, both ramp time and delay are characterized in an approximate manner by the use of a quadratic expression of the form:

$$Axy+Bx+Cy+D$$

wherein x is load, y is ramp time, and the coefficients are dependent on the nature of the buffer buf and the quantity to be determined either, delay or ramp time. The two functions so defined are Delay(buf, load, ramp time) and Ramp time(buf, load, ramp time). Finally, for the sake of completeness, a dummy buffer, equivalent to the insertion of no buffer, is added to the buffer set B for circumstances wherein no additional delay needs to be inserted.

Tradeoff Function

Figure 5:
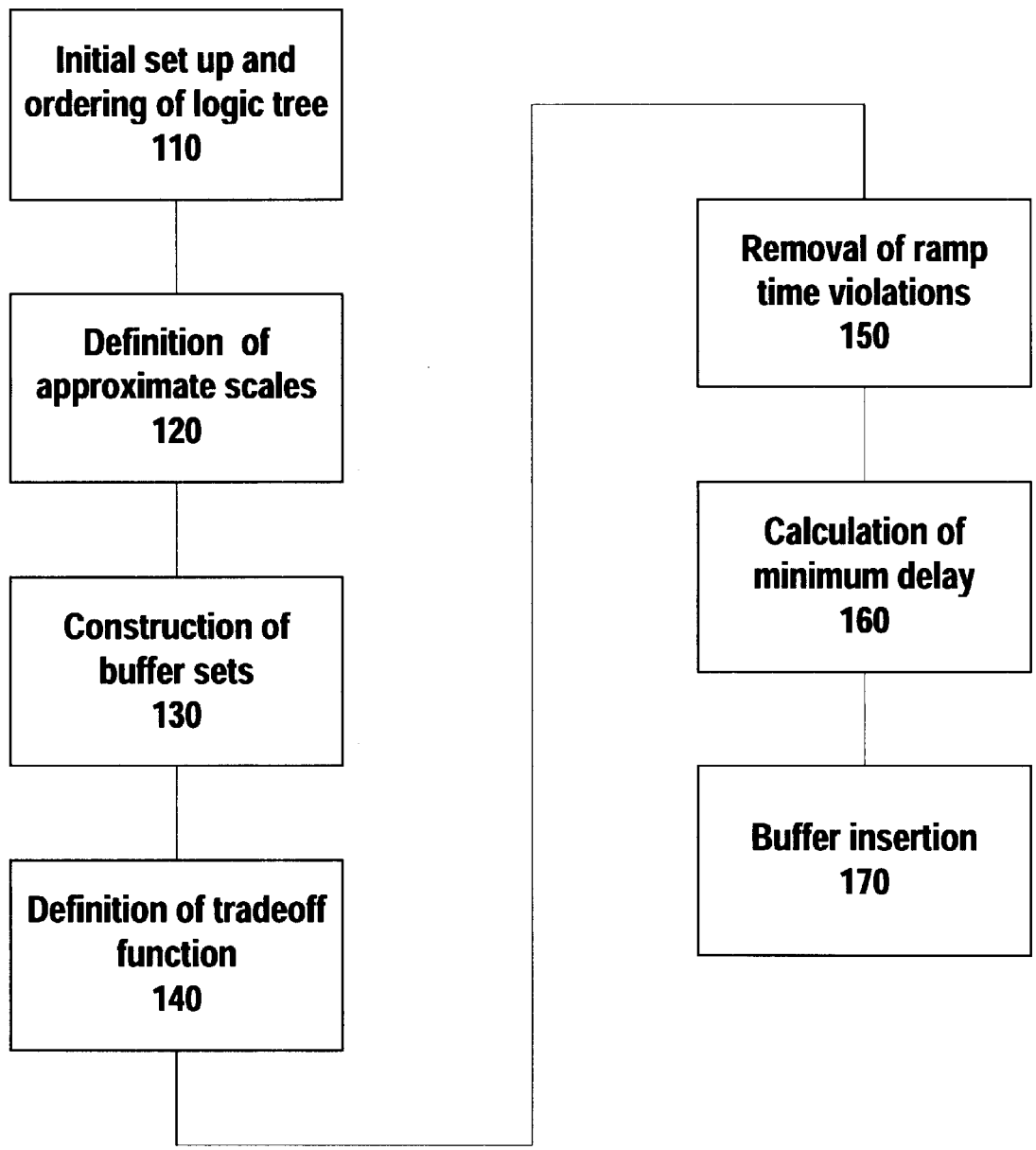
FIG. 5 is a flowchart illustrating the process steps of the present invention.

The next step, and a key to the invention, is the use of a tradeoff function TF which is used to define a monotonically decreasing step-function as represented in block 140 of FIG. 5. The tradeoff function is computed at each vertex or node on the tree and is a function of departure time, load, and ramp time. For a given ramp time, the function includes all possible pairs of the form (d,l) wherein d is the estimated departure time for the node and l is the load on the buffer if it is inserted at that node. Thus, the function may be graphically represented with the delay time as the x-axis and the load as the y-axis. Within the set F, all pairs of the form $(d_0, l_0)$ such that $d<d_0$ and $l<l_0$ can be absorbed by the smaller pairs and thus omitted from the set. This in turn leads to a reduced set RF of pairs which are preferably shown graphically as a monotonically decreasing step function for the node or vertex.

The tradeoff function thus depicts graphically the tradeoff in departure time and buffer load. In other words, for a given ramp time, it shows the delay which will be associated with an given buffer load. The stepwise nature of the function is a result of the approximation obtained by converting real values of load, delay, and ramp time into approximate values along indices.

Operation Using Tradeoff Function and Removal of Ramp-time Violations

In addition to the tradeoff functions themselves, a series of mathematical operations on the tradeoff functions are preferably defined for later use in the method. Assuming two tradeoff functions, $TF_1(x)$ and $TF_2(x)$, are at least partially defined along some delay index D operations on the tradeoff functions are defined in the following manner.

The sum or addition of the two functions, labeled $TF_3(x)$ is defined if both $TF_1(x)$ and $TF_2(x)$ are defined and the combined load values of the tradeoff functions does not exceed a predetermined maximum. In other words, if $l(TF_1(x))+l(TF_2(x))<$loadmax. In such case, $TF_3(x)=Ind(l(TF_1(x))+l(TF_2(x)))$.

Similarly, the minimum of the two tradeoff functions, labeled here as $TF_4(x)$, is defined if either $TF_1(x)$ or $TF_2(x)$ are defined, and is determined in the following manner:

$TF_4(x)$ min($TF_1(x)$, $TF_2(x)$), if both $TF_1(x)$ and $TF_2(x)$ are defined $TF_4(x)=TF_1(x)$, if $TF_1(x)$ is defined but $TF_2(x)$ is not defined $TF_4(x)=TF_2(x)$, if $TF_2(x)$ is defined but $TF_1(x)$ is not defined It is noted that while in the above examples the operations $TF_3$ and $TF_4$ are shown acting on only two tradeoff functions, the operations can be extended in an analogous manner to operate over three or more tradeoff functions.

An additional operation $TF_5(x)$ is defined to represent the effect on values of the tradeoff function when an additional load is inserted at the vertex.

$TF_5(x)=$addload(TF(x),lnew) is defined so long as the initial load plus the new load does not exceed a predetermined loadmax. In other words, $l(TF(x))+lnew<$loadmax and $TF_5(x)=$addload(TF(x),l)=Ind(l(TF(x))+lnew).

Finally, an operation is defined to determine the effect on a tradeoff function when a buffer is inserted into the tree at the vertex and the ramp time index is thus changed from index i to index j. Let the function to be operated upon $TF_i(x)$ be a tradeoff function for a given ramp time index i along the ramp time index R. As mentioned above, the stepwise graph of the tradeoff function assumes the ramp time index is fixed and depicts the relationship between varying departure time and load. Further, let j be a new index along the ramp time scale and let buf represent a buffer sequence from the buffer set B for insertion into the tree.

The new operation, $TF_j(x)=$insert($TF_i(x)$, buf,j) is preferably carried out in by the following process:

First, portions of the domain of the original tradeoff function $TF_i(x)$ are removed or cut away for which the following inequality is not satisfied:

$$\text{Ramptime}(buf, TF_i(x), r(i)) < r(j) \quad (1)$$

That is, points in the set of departure times and load which, when the buffer buf is inserted, exceed the specified ramp time, index r(j) is removed from consideration. It is appreciated that by this r(j) is specified as the maximum allowable ramp time and violations of the ramp time are thereby preferably removed as noted in block 150 of FIG. 5.

Note that due to the iterative nature of the method of the invention, it is preferred to store the value of the reduced or cut tradeoff function which satisfy the inequality of equation (1) for later use in the method.

From those values which satisfy the inequality (1), the minimum value of the delay for the buffer insertion is determined and denoted as $x_0$.

$$\text{Delay}(buf, TF_i(x), r(j)) + d(x) \rightarrow \text{minimum} = x_0 \quad (2)$$

For all $x > x_0$, the function after insertion of the buffer buf is defined as $TF_j(x)=$Ind(load(buf)). This new function is still a step function, however, the step function now includes only a single step which corresponds to load(buf), the load on the input pin of the buffer.

Vector Tradeoff Functions and their Operations

As described above, the tradeoff function preferably varies with ramp time, departure time, and load. For most of the foregoing discussion, the ramp time has been assumed to be fixed, so that the tradeoff function becomes a step function showing the interrelationship between departure time and load. In order to consider changes in the ramp time index as well, a new vector tradeoff function VTF is preferably defined wherein the elements of the vector are preferably the tradeoff functions corresponding to the various ramp time indices. Thus, $$VTF_1=(TF1_0(x), TF1_1(x), \ldots, TF1_n(x))$$

where $TF_i(x)$ corresponds to a tradeoff function for a given ramp time index i, or in other words, i=0, 1, . . . , n along the ramp time index.

In an analogous manner, vector functions are preferably created for addition of two vector tradeoff functions, namely minimization and addition of a load. For each ramp time index the corresponding tradeoff functions are operated upon in the previously described manner and the results are preferably collected into a new vector spanning having one element for each ramp time index.

Calculation of the Buffer Insertion Vector Operation

A vector function for the insertion of buffers is preferably determined in a manner analogous to the aforementioned $TF_j(x)=$insert($TF_i(x)$,buf,j).

For a given ramp time index j=0, 1, . . . , n, n+1, one step step functions of the form insert($TF1_0(x)$,buf,j), insert($TF1_1(x)$,buf,j), . . . , insert($TF1_n(x)$,buf,j) are computed. Among these step functions, the function, insert($TF1_k(x)$,buf,j), for which the value of $x_0$ as determined by equation (2) is minimized in comparison to the others is then determined and for a given ramp time index, $TF2_j(x)=\text{insert}(TF1_k(x), \text{buf}, j)$.

Finally, the buffer insertion vector is formed by compiling the TF2 functions for each ramp time index, as given by:

$$VTF_2=\text{insert}(VTF_1, \text{buf})=(TF2_0(x), TF2_1(x), \ldots, TF2_n(x))=\text{insert}(VTF_1, \text{buf})$$

Delay Reduction

The aforementioned tradeoff function operations and vector operations are put to use in the reduction of the delays in the net tree. Such optimization of the net tree comprises calculating the vector tradeoff function for each vertex of the tree and using the function to determine the buffer insertion which minimizes net delay, depicted as step 160 in FIG. 5.

Because a signal may be sent in either direct or inverted form and because the delays for the two forms may not be the same, at each vertex v of the net tree TD, two vector tradeoff functions are calculated, dir_VTF[v] and inv_VTF[v] for direct and inverted signals in the vertex respectively. The calculation is carried out over each vertex of the tree in topological order beginning with the leaves of the tree and proceeding to the root.

In order to begin the optimization, the values of the tradeoff functions for each vertex must first be initialized. The "leaves" or inputs to the logic tree are preferably initialized first.

Each leaf is preferably initialized such as by setting TF(x)=Ind(init_load_v) for all x>d(init_d_v) and each ramp time index i, where init_load_v and init_d_v are preferably the initial preset values for load and departure time respectively.

The direct vector tradeoff function is preferably composed of the individual tradeoff functions for each ramp time index, such as given by dir_VTF[V]=(TF, TF, . . . , TF). Notably, at this initialization stage, the inverted vector tradeoff function inv_VTF[v] is left undefined.

After the leaves are initialized, the remaining, higher order vertices are preferably each initialized, preferably by first summing the corresponding tradeoff functions for its predecessor vertices $v_l, \ldots, v_m$, along the wire from the leaf to the vertex, such as by:

$$dir\_VTF[v]=dir\_VTF[v_l]+\ldots+dir\_VTF[v_m], \text{ and}$$

$$inv\_VTF[v]=inv\_VTF[v_l]+\ldots+inv\_VTF[v_m]$$

and then correcting the functions to account for the extra load along the wires from the leaf to the vertex. Thus, $$dir\_VTF[v]=\text{add}\_{load}(dir\_VTF[v], load\_v)$$

$$inv\_VTF[v]=\text{add}\_load(inv\_VTF[v], load\_v)$$

where load_v is load determined by wires between v and its predecessors $v_l, \ldots, v_m$.

The optimization process consists of determining the buffer insertion which minimizes the vector tradeoff functions, or in other words, the buffer insertion which preferably leads to the minimal net delay. This is preferably accomplished by computation of four auxiliary vector tradeoff functions for each vertex v, dir_dir_VTF[v], dir_inv_VTF[v], inv_dir_VTF[v], and inv_inv_VTF[v].

These four functions represent the four possible combinations and inverted and directed, or noninverted, signal entering and leaving a buffer at a given vertex. Thus, the function dir_dir represents the case of a vertex wherein a direct (noninverted) signal is received and wherein a noninverting buffer is inserted so that the output signal is also direct. The function dir_inv represents the case of a direct input signal and the insertion of a inverting buffer so that the output signal is inverted. For the function inv_dir, the input is inverted and the buffer inserted is also inverted so that the output is thus noninverted or direct. Finally inv_inv represents an inverted input signal and a noninverting buffer insertion so that the output remains inverted.

For each potential noninverting buffer insertion, the effect of the insertion is analyzed by calculating the auxiliary VTFs dir_dir_VTF and inv_inv_VTF as follows:

$$dir\_dir\_VTF[v]=\min(dir\_dir\_VTF[v], \text{insert}(dir\_VTF, \text{buf}))$$

$$inv\_inv\_VTF[v]=\min(inv\_inv\_VTF[v], \text{insert}(inv\_VTF, \text{buf}))$$

In the same manner, for each potential inverting buffer insertion, the auxiliary VTFs inv_dir_VTF and dir_inv_VTF are calculated as:

$$inv\_dir\_VTF[v]=\min(inv\_dir\_VTF[v], \text{insert}(dir\_VTF, \text{buf}))$$

$$dir\_inv\_VTF[v]=\min(dir\_inv\_VTF[v], \text{insert}(inv\_VTF, \text{buf}))$$

Then, for both the inverting and noninverting insertions, the option which reduces and preferably minimizes the tradeoff function is preferably selected. That is:

$$dir\_VTF[v]=\min(dir\_dir\_VTF[v], dir\_inv\_VTF[v])$$

$$inv\_VTF[v]=\min(inv\_dir\_VTF[v], inv\_inv\_VTF[v])$$

After the optimal buffer insertion is determined for a given vertex, the proceed is repeated for the next higher vertex in topological order.

Buffer Insertion

Finally, after auxiliary vector functions are calculated for each vertex, the actual buffer insertion, 170, is preferably carried out. While the optimization calculations were carried out beginning with the inputs or leaves of the tree and proceeding in topological order to the root, the actual buffer insertion is preferably carried out by in the reverse order, starting with the root and proceeding to the lower order vertices.

As the buffer insertion proceeds through the logic tree, it is preferred that an inversion flag is also set and passed backwards through the logic tree to indicate whether the vector trade function currently being implemented is of an inverted buffer form or not. The flag 1 represents a noninverted signal while the flag 0 represents an inverted signal. Information about the previously inserted buffer is also passed on to the lower order vertices.

As previously described, the four auxiliary tradeoff functions, dir_dir_VTF[v], dir_inv_VTF[v], inv_dir_VTF[v], and inv_inv_VTF[v] are computed for the vertex as previously described. These functions are preferably recalled from previous calculations or given the fast nature of the computations, they may alternately be recomputed as needed.

If the flag indicates an inversion is called for, or in other words if the inversion flag equals one, then the buffer insertion is preferably determined based upon the minimization of the inv_VTF function as described with respect to the optimization calculation step.

Likewise, if no inversion is indicated, the buffer insertion is preferably based on the dir_VTF. The buffer is preferably inserted, the inversion flag is preferably reset, and the information is preferably passed to the next vertex in the tree.

If the inversion flag is equal to zero, there is preferably no preference for use of either inverting or noninverting buffers, and both options are analyzed.

The buffer insertion process is thus preferably repeated, vertex by vertex, until all vertices of the logic tree are completed, whereupon the method is completed to provide a revised logic tree with appropriate buffers inserted therein, with minimized delay, and with ramp time violations removed.

Figure 4A:
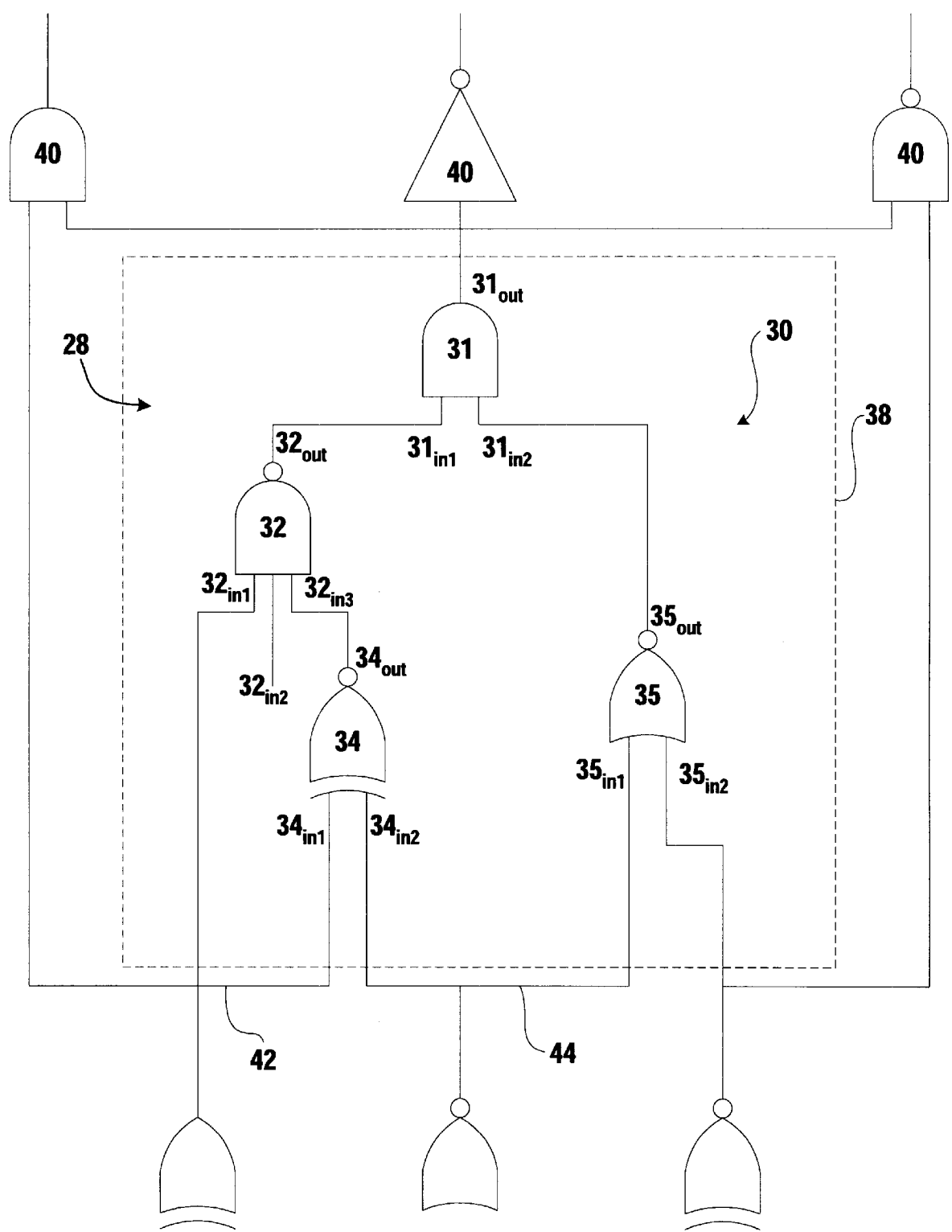
FIGS. 4a and 4b depict, respectively, an exemplary logic tree before and after optimization and buffer insertion according to the present invention.
Figure 4B:
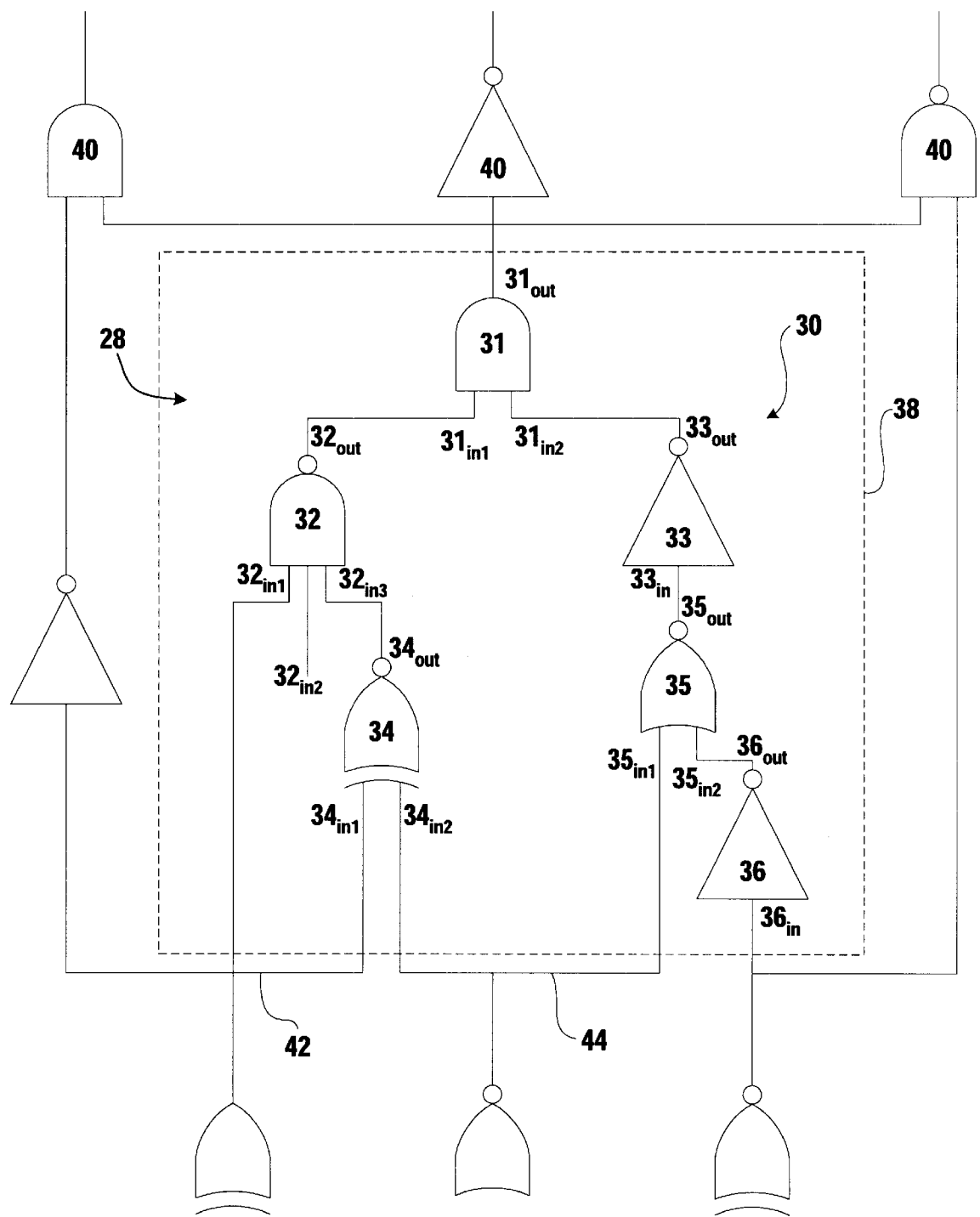

The effect of the revisions to the logic tree accomplished by the invention are seen by reference to FIGS. 4a and 4b. FIG. 4a depicts an exemplary logic tree comprising a plurality of logic gates prior to optimization and buffer insertion according to the invention. The logic tree is optimized and buffers are inserted by carrying out the process oulined steps 110–170 in FIG. 5.

An initial ordering is assigned to the vertices of the tree (110), real values of load, delay, and ramptime are coverted to approximate scales (120), buffer set are constructed from a library (130), a tradeoff function is defined for each vertex (140) and well as preferably tradeoff function vectors and and operations, ramptime violations are removed from the tradeoff functions (150), a minimum delay insertion is calculated for each vertex (160), and finally appropriate delay buffers are inserted (170). The resultant logic tree may be seen in FIG. 4b, which depicts the logic tree as modified by the insertion of buffers according to the present invention.

The method of the invention has been described without respect to the computational apparatus used to execute the method. However, it is appreciated by those of skill in the art that the method may readily be adapted for use in the form of a computer program, which is preferably stored on a computer storage media. The program may then be executed on a computer to facilitate the numerous repetitive computations involved in the inventive method.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for reduction of net delays and insertion of buffers in a logic tree having nodes, a root, and a plurality of leaves, the method comprising the steps of:

inserting a plurality of auxiliary nodes into the tree so that none of the nodes is a greater distance removed from an adjacent one of the nodes than a predetermined value, defining discrete, approximate scales for delay, load, and ramp time, constructing a set of buffer chains for insertion into the net tree from a library set of buffers, for each node on the tree, determining a tradeoff function relating ramp time, departure time, and load at the node, for each node on the tree, removing combinations of the tradeoff function and the buffer chains, which when such buffer chains are inserted into the tradeoff function, produce a ramp time that exceeds a predetermined maximum allowable ramp time, for each node on the tree, using the tradeoff function to determine a minimum delay to insert, and inserting the buffer chain corresponding to the minimum delay as determined by the tradeoff function.

2. The method of claim 1 wherein the minimum delays are calculated in order from the leaves of the tree to the root of the tree and the buffer chains are inserted in reverse order from the root of the tree to the leaves of the tree.

3. The method of claim 1 wherein at least one of the approximate scales is a logarithmic scale.

4. The method of claim 1 wherein the buffer chains include combinations of inverting buffers and noninverting buffers.

5. The method of claim 1 wherein the tradeoff function for each node of the tree is a monotonically decreasing step function.

6. The method of claim 1 wherein the tradeoff function is a vector function.

7. A program on a readable computer storage medium including instructions for performing a method for reduction of net delays and insertion of buffers in a logic tree having a root and a plurality of leaves, said method comprising:

inserting a plurality of auxiliary nodes into the tree so that no node is a greater distance removed from a next node than a predetermined value, defining discrete, approximate scales for delay, load, and ramp time, constructing, from a library set of buffers, a set of buffers chains for later insertion into the net tree, determining for each node on the tree a tradeoff function relating ramp time, departure time and load at the node, for each node, removing combinations of the tradeoff functions and the buffer chains, which when inserted into the tradeoff function, lead to a ramp time which exceeds a predetermined maximum allowable ramp time, for each node, using the tradeoff function to determine a minimum delay to insert, and inserting the buffer chain corresponding to the minimum delay as determined by the tradeoff function.

8. The program of claim 7 wherein the minimum delays are calculated in order from the leaves of the tree to its root and the buffer chains are thereafter inserted in reverse order from the root to the leaves.

9. The program of claim 7 wherein at least one of the approximate scales is a logarithmic scale.

10. The program of claim 7 wherein the buffer chains include combinations of inverting and noninverting buffers.

11. The program of claim 7 wherein the tradeoff function for each node is a monotonically decreasing step function.

12. The program of claim 7 wherein the tradeoff function is a vector function.

13. A computing device configured to perform a method for reduction of net delays and insertion of buffers in a logic tree having a root and a plurality of leaves, said method comprising:

inserting a plurality of auxiliary nodes into the tree so that no node is a greater distance removed from a next node than a predetermined value, defining discrete, approximate scales for delay, load, and ramp time, constructing, from a library set of buffers, a set of buffers chains for later insertion into the net tree, determining for each node on the tree a tradeoff function relating ramp time, departure time and load at the node, for each node, removing combinations of the tradeoff functions and the buffer chains, which when inserted into the tradeoff function, lead to a ramp time which exceeds a predetermined maximum allowable ramp time, for each node, using the tradeoff function to determine a minimum delay to insert, and inserting the buffer chain corresponding to the minimum delay as determined by the tradeoff function.

14. The computing device of claim 13 wherein the minimum delays are calculated in order from the leaves of the tree to its root and the buffer chains are thereafter inserted in reverse order from the root to the leaves.

15. The computing device of claim 13 wherein at least one of the approximate scales is a logarithmic scale.

16. The computing device of claim 13 wherein the buffer chains include combinations of inverting and noninverting buffers.

17. The computing device of claim 13 wherein the tradeoff function for each node is a monotonically decreasing step function.

18. The computing device of claim 13 wherein the tradeoff function is a vector function.

* * * * *